(12) United States Patent
Fan

(10) Patent No.: US 10,811,491 B2
(45) Date of Patent: Oct. 20, 2020

(54) DISPLAY SUBSTRATE AND METHOD OF MANUFACTURING THE SAME, AND DISPLAY PANEL

(71) Applicant: BOE TECHNOLOGY GROUP CO., LTD., Beijing (CN)

(72) Inventor: Xing Fan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/541,315

(22) Filed: Aug. 15, 2019

(65) Prior Publication Data

US 2020/0212162 A1 Jul. 2, 2020

(30) Foreign Application Priority Data

Jan. 2, 2019 (CN) .......................... 2019 1 0002395

(51) Int. Cl.
*H01L 51/00* (2006.01)
*H01L 27/00* (2006.01)
(Continued)

(52) U.S. Cl.
CPC ...... *H01L 27/3279* (2013.01); *H01L 27/3246* (2013.01); *H01L 51/5212* (2013.01); *H01L 51/5228* (2013.01); *H01L 51/56* (2013.01)

(58) Field of Classification Search
CPC ............. H01L 27/3279; H01L 27/3246; H01L 27/3276; H01L 27/3262; H01L 27/3258;
(Continued)

(56) References Cited

U.S. PATENT DOCUMENTS 8,026,667 B2 * 9/2011 Kwak ................. H01L 27/3276
313/500
9,748,318 B2 8/2017 Shim et al.
(Continued)

FOREIGN PATENT DOCUMENTS

| CN | 106057844 A | 10/2016 |
| CN | 108023026 A | 5/2018 |
| CN | 109103215 A | 12/2018 |

OTHER PUBLICATIONS

First Chinese Office Action from corresponding Chinese Patent Application No. 201910002395.1 dated Jul. 31, 2020.

*Primary Examiner* — Nikolay K Yushin
(74) *Attorney, Agent, or Firm* — Dilworth & Barrese, LLP.; Michael J. Musella, Esq.

(57) ABSTRACT

A display substrate and a method of manufacturing the same, and a display panel are provided. The display substrate includes: a base substrate, and a first electrode, a first auxiliary electrode, a boss, a pixel definition layer, an organic functional layer and a second electrode provided on the base substrate. The first auxiliary electrode includes a first conductive connection part contacting a side surface of the boss; the pixel definition layer is provided with a pixel accommodating hole and a slot; the organic functional layer is electrically connected with the first electrode through the pixel accommodating hole; and the second electrode is electrically connected with the first conductive connection part through the slot, so that the second electrode is connected with the first auxiliary electrode in parallel.

16 Claims, 7 Drawing Sheets

(51) Int. Cl.
*H01L 27/32* (2006.01)
*H01L 51/52* (2006.01)
*H01L 51/56* (2006.01)

(58) Field of Classification Search
CPC .. H01L 51/5212; H01L 51/5228; H01L 51/56
See application file for complete search history.

(56) References Cited

U.S. PATENT DOCUMENTS

| | | | |
|---|---|---|---|
| 10,096,671 B2 * | 10/2018 | Oh | H01L 27/322 |
| 10,591,787 B2 | 3/2020 | Shim et al. | |
| 2005/0200270 A1 * | 9/2005 | Kwak | H01L 27/3276 |
| | | | 313/502 |
| 2015/0144906 A1 | 5/2015 | Ichikawa | |
| 2018/0006106 A1 * | 1/2018 | Oh | H01L 27/322 |
| 2019/0229152 A1 | 7/2019 | Wang | |

* cited by examiner

DISPLAY SUBSTRATE AND METHOD OF MANUFACTURING THE SAME, AND DISPLAY PANEL

CROSS REFERENCE TO RELATED APPLICATIONS

This application claims the priority of Chinese patent application No. 201910002395.1 entitled "DISPLAY SUBSTRATE AND METHOD OF MANUFACTURING THE SAME, AND DISPLAY PANEL" submitted to CNIPA on Jan. 2, 2019, the full text of which is incorporated herein by reference.

TECHNICAL FIELD

Embodiments of the present disclosure relate to a display substrate and a method of manufacturing the same, and a display panel.

BACKGROUND

In the organic light-emitting diode (OLED) with a top emission structure, the light transmittance of the top transmission electrode directly determines the light-emitting efficiency of the organic light-emitting diode. In order to ensure the light transmittance of the top transmission electrode, the top transmission electrode is often made very thin, but the resistance of the top transmission electrode will be quite great.

For organic light-emitting diode display panels, because of the great resistance of the top transmission electrode, a significant IR Drop of the top transmission electrode would be present, which would result in poor brightness uniformity of the organic light-emitting diode display panel.

SUMMARY

At least one embodiment of the present disclosure provides a display substrate, comprising: a base substrate, and a first electrode, a first auxiliary electrode, a boss, a pixel definition layer, an organic functional layer, and a second electrode provided on the base substrate. The first auxiliary electrode comprises a first conductive connection part contacting a side surface of the boss; the pixel definition layer is provided with a pixel accommodating hole and a slot; the organic functional layer is electrically connected with the first electrode through the pixel accommodating hole; and the second electrode is electrically connected with the first conductive connection part through the slot, so that the second electrode is connected with the first auxiliary electrode in parallel.

For example, a surface of the boss facing away from the base substrate has an orthographic projection on the base substrate completely overlapping with an orthographic projection of the boss on the base substrate.

For example, the first conductive connection part is disposed in a predetermined area on the side surface of the boss; the organic functional layer comprises a hollow structure in the predetermined area; the second electrode is electrically connected with the first conductive connection part through the hollow structure; the pixel accommodating hole is communicated with the first electrode; and the slot is communicated with the first conductive connection part.

For example, the boss includes material of a negative photoresist.

For example, a thin film transistor is disposed between the first electrode and the base substrate, the thin film transistor comprising: a gate electrode, a source electrode and a drain electrode, wherein the first electrode is electrically connected to the source electrode or the drain electrode.

For example, the display substrate further comprises a second auxiliary electrode connected with the first auxiliary electrode in parallel. The second auxiliary electrode is disposed in a same layer as at least one of the gate electrode, the source electrode and the drain electrode.

For example, the first auxiliary electrode further comprises a second conductive connection part disposed in a same layer as, and electrically connected with the first conductive connection part; and the second conductive connection part is electrically connected with the second auxiliary electrode.

For example, the display substrate further comprises an insulating structure disposed between the first auxiliary electrode and the second auxiliary electrode. The insulating structure is provided with a via hole structure, and the first auxiliary electrode is electrically connected with the second auxiliary electrode through the via hole structure.

For example, the first auxiliary electrode is disposed in a same layer as the first electrode.

For example, a dihedral angle theta formed by the side surface of the boss and the surface of the boss facing away from the base substrate is equal to or greater than 60 degrees and equal to and less than 90 degrees.

At least one embodiment also provides a method of manufacturing a display substrate, comprising: forming a first electrode, a first auxiliary electrode, a boss, a pixel definition layer, an organic functional layer and a second electrode on a surface of a base substrate, the forming the first auxiliary electrode on the surface of the base substrate comprising forming a first conductive connection part of the first auxiliary electrode contacting a predetermined area on a side surface of the boss; and forming a pixel accommodating hole and a slot in the pixel definition layer. The organic functional layer is electrically connected with the first electrode through the pixel accommodating hole, and the second electrode is electrically connected with the first conductive connection part through the slot and is connected with the first auxiliary electrode in parallel.

For example, a surface of the boss facing away from the base substrate has an orthographic projection on the base substrate completely overlapping with an orthographic projection of the boss on the base substrate; the first conductive connection part is formed in a predetermined area on a side surface of the boss; and a hollow structure is formed in the predetermined area in the organic functional layer, and the second electrode is electrically connected with the first conductive connection part through the hollow structure. The forming the boss on the surface of the base substrate comprises: coating a negative photoresist on the surface of the base substrate; exposing the negative photoresist in an area where a boss is to be formed; and developing the negative photoresist to form the boss.

For example, the first auxiliary electrode and the first electrode are formed in a same patterning process.

For example, the forming the first auxiliary electrode on the surface of the base substrate comprises: forming a first conductive film by a sputtering process or an atomic layer deposition process on a surface of the base substrate, the surface of the boss facing away from the base substrate and the side surface of the boss; and patterning the first conductive film to form a pattern of the first auxiliary electrode, wherein the first auxiliary electrode comprises the first conductive connection part contacting the predetermined area on the side surface of the boss.

For example, the forming the organic functional layer on the surface of the base substrate comprises: forming the organic functional layer on a surface of the pixel definition layer facing away from the base substrate, in the pixel accommodating hole and in the slot by an evaporation process, wherein the organic functional layer is a hollow structure in the predetermined area, so that the first conductive connection part is exposed through the hollow structure.

For example, the forming the second electrode on the surface of the base substrate: forming a second conductive film by a sputtering process or an atomic layer deposition process on a surface of the organic functional layer facing away from the base substrate and the hollow structure, the second conductive film being electrically connected with the first conductive connection part through the hollow structure, and the second conductive film serving as the second electrode.

For example, before forming the first electrode, the first auxiliary electrode and the boss on the surface of the base substrate, forming a thin film transistor on the surface of the base substrate, wherein the thin film transistor comprises: a gate electrode, a source electrode and a drain electrode, and the first electrode is electrically connected with the source electrode or the drain electrode.

For example, forming a second auxiliary electrode. The second auxiliary electrode is connected with the first auxiliary electrode in parallel, and the second auxiliary electrode is formed in a same patterning process as at least one of the gate electrode, the source electrode, and the drain electrode.

For example, forming an insulating structure between the first auxiliary electrode and the second auxiliary electrode. A via hole structure is provided in the insulating structure, and the first auxiliary electrode is electrically connected with the second auxiliary electrode through the via hole structure.

At least one embodiment of the present disclosure also provides a display panel, comprising: the display substrate.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions of the embodiments will be described in a clearly and fully understandable way in connection with the drawings related to the embodiments of the present disclosure. It is apparent that the described embodiments are just a part but not all of the embodiments of the present disclosure. Based on the described embodiments herein, one of ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right" or the like are only used to indicate relative position relationship, and when the position of the object which is described is changed, the relative position relationship may be changed accordingly.

Herein, two structures "in a same layer" refers to that they are formed by patterning a same material layer, and thus they are in the same layer in terms of layer stack. However, this does not represent that the distances between these structures and the base substrate are equal to each other, nor does it represent that they are completely the same as other layer structures on the base substrate.

Figure 1A:
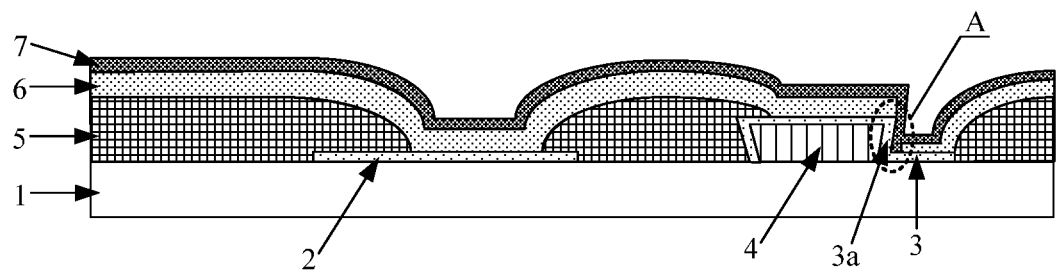
FIG. 1A is a schematically cross-sectional view of a display substrate provided in an embodiment of the present disclosure.
Figure 1B:
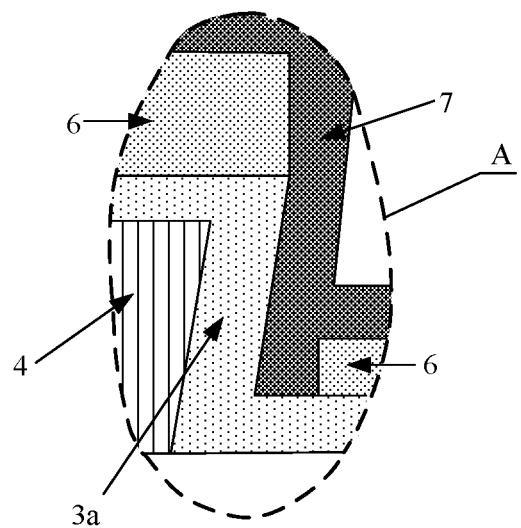
FIG. 1B is a enlarged schematic view of area A in FIG. 1A.
Figure 1C:
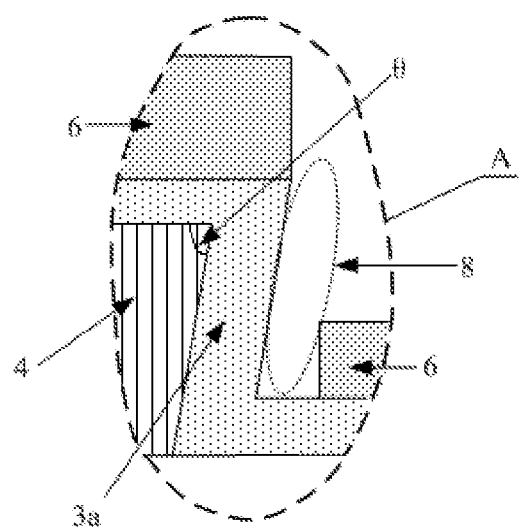
FIG. 1C is a schematic view of an organic functional layer with a hollow structure at a predetermined area A.

FIG. 1A is a schematically cross-sectional view of a display substrate provided by an embodiment of the present disclosure, FIG. 1B is an enlarged schematic view at a predetermined area A in FIG. 1A, and FIG. 1C is a schematic view of an organic functional layer forming a hollow structure on a side surface of a boss. As shown in FIGS. 1A to 1C, the display substrate comprises: a base substrate 1, and a first electrode 2, a first auxiliary electrode 3, a boss 4, a pixel definition layer 5, an organic functional layer 6, and a second electrode 7, which are formed on the base substrate 1.

The orthographic projection of the surface of the boss 4 facing away from the base substrate 1 on the base substrate 1 completely overlaps with the orthographic projection of the boss 4 on the base substrate 1. The first auxiliary electrode 3 comprises a first conductive connection part 3a contacting a predetermined area A on the side surface of the boss 4. For example, the first conductive connection part 3a is attached to the predetermined area A.

The pixel definition layer 5 is located on a side of the first electrode 2 facing away from the base substrate 1. The pixel definition layer 5 is provided with a pixel accommodating hole and a slot. The pixel accommodating hole is communicated with the first electrode 2 and the slot is communicated with the first conductive connection part 3a.

The organic functional layer 6 is located on a side of the pixel definition layer 5 facing away from the base substrate 1. The organic functional layer 6 is electrically connected to the first electrode 2 through the pixel accommodating hole. The organic functional layer 6 includes a hollow structure 8 at a predetermined area A.

The second electrode 7 is located on a side of the organic functional layer 6 facing away from the base substrate 1. The second electrode 7 is electrically connected to the first conductive connection part 3a through the hollow structure 8 so that the second electrode 7 is connected with the first auxiliary electrode 3 in parallel.

In the above display substrate, the first electrode 2, the organic functional layer 6, and the second electrode 7 form an organic light-emitting diode. One of the first electrode 2 and the second electrode 7 is a cathode and the other is an anode, and the organic functional layer 6 at least comprises an organic light-emitting layer. For example, in order to improve the efficiency of carrier injection into the organic light-emitting layer, the organic functional layer 6 may further selectively comprise functional film layers, such as a hole transport layer, an electron transport layer, a hole blocking layer, an electron blocking layer, or the like.

In the embodiments of the present disclosure, the display substrate comprises a display area and a peripheral area outside the display area, the display area is configured to realize display, and the peripheral area can be configured to arrange a driving circuit, packaging the display substrate, or the like.

In t embodiments of the present disclosure, the manner in which the second electrode 7 and the first auxiliary electrode 3 are connected in parallel includes, but is not limited to the following cases.

For example, with reference to FIG. 1A, in the display area, the second electrode 7 is in contact with the first conductive connection part 3a at the predetermined area A and has a certain contact area. In this case, the portion of the second electrode 7 that is in contact with the first conductive connection part 3a is connected with the first conductive connection part 3a in parallel, that is, the second electrode 7 is connected with the first auxiliary electrode 3 in parallel.

For example, with reference to FIG. 1A again, the first auxiliary electrode 3 includes not only the first conductive connection part 3a, but also a lead-out part (not shown) electrically connected to the first conductive connection part 3a and extending to the peripheral area. In this case, in the display area, the second electrode 7 is in contact with the first conductive connection part 3a at the predetermined area A, and in the peripheral area, the second electrode 7 is in contact with the lead-out part, so that the second electrode 7 and the first auxiliary electrode 3 are connected at both ends respectively to form a parallel circuit.

Figure 2:
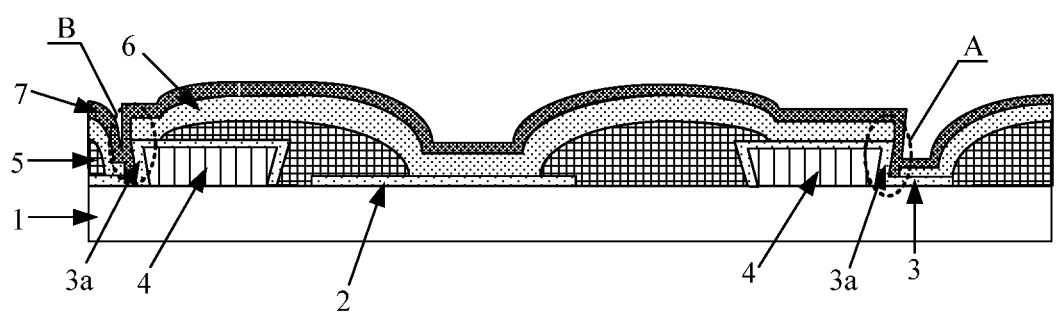
FIG. 2 is a schematically cross-sectional view of another display substrate provided in the embodiment of the present disclosure.

FIG. 2 is a schematically cross-sectional view of another display substrate provided by the embodiment of the present disclosure. As shown in FIG. 2, for example, both ends of the second electrode 7 and the first auxiliary electrode 3 connected to each other are located in the display area. For example, the first auxiliary electrode 3 comprises two first conductive connection parts 3a that are electrically connected, and the two first conductive connection parts 3a are located on the side surfaces of the two bosses 4, respectively. In this case, the second electrode 7 is in contact with the two first auxiliary electrodes 3 at the predetermined area A and the predetermined area B, respectively, so that the second electrode 7 and the first auxiliary electrodes 3 are connected at both ends respectively to form a parallel circuit.

After the second electrode 7 and the first auxiliary electrode 3 are connected in parallel, when the second electrode 7 receives a voltage signal and transmits the voltage signal, and when the voltage signal reaches the first auxiliary electrode 3 electrically connected with the second electrode 7, the first auxiliary electrode 3 serves as a branch for transmitting the voltage signal and transmits the voltage signal simultaneously with the second electrode 7, i.e., the second electrode 7 and the first auxiliary electrode 3 form a parallel circuit, in this way, the resistance in the process of transmitting the voltage is reduced; or, the first auxiliary electrode 3 may first receive a voltage signal, and when the voltage signal reaches the second electrode 7 electrically connected to the first auxiliary electrode 3, the second electrode 7 serves as a branch for transmitting the voltage signal and transmits the voltage signal simultaneously with the first auxiliary electrode 3; or, the second electrode 7 and the first auxiliary electrode 3 simultaneously receive voltage signals, and the second electrode 7 and the first auxiliary electrode 3 simultaneously transmit voltage signals as two branches.

It is to be noted that in the embodiments of the present disclosure, the manner in which the second electrode 7 and the first auxiliary electrode 3 are connected in parallel may vary, but at least one first conductive connection part 3a contacting the side surface of the boss 4 and capable of being electrically connected to the second electrode 7 exists in the first auxiliary electrode 3. In addition, one or more of the first auxiliary electrodes 3 may be provided in the embodiments of the present disclosure.

In the embodiments of the present disclosure, by arranging the first auxiliary electrode 3 and connecting the first auxiliary electrode 3 with the second electrode 7 in parallel, the equivalent resistance at the second electrode 7 can be reduced, and the IR Drop generated by the second electrode 7 can be effectively reduced.

In the embodiments of the present disclosure, the orthographic projection of the surface of the boss 4 facing away from the base substrate 1 (for convenient, named as the upper surface of the boss 4) on the base substrate 1 completely overlaps with the orthographic projection of the boss 4 on the base substrate 1 (i.e., the upper surface of the boss 4 can cover the entire boss 4), that is, the surface of the boss 4 is perpendicular to the upper surface thereof, or the side surface of the boss 4 is entirely inclined inward. In this case, the first conductive connection part 3a (part of the first auxiliary electrode 3) is attached to the predetermined area A on the side surface of the boss 4 in advance, and when the organic functional layer 6 is subsequently formed by an evaporation process, the organic functional layer 6 is naturally break off at the side surface of the boss 4 (i.e., the organic functional layer 6 will not be deposited along the side surface of the boss 4) to form a hollow structure 8. In this case, the first conductive connection part 3a attached to the side surface of the boss 4 is exposed through the hollow structure 8, and when the second electrode 7 is subsequently formed, the second electrode 7 can be directly connected to the first conductive connection part 3a to realize the parallel connection between the second electrode 7 and the first conductive connection part 3a.

In the embodiments of the present disclosure, by providing the boss 4, the hollow structure 8 can be automatically formed on the organic functional layer 6 without changing the preparation process of the organic functional layer 6 (in this way, no additional patterning process is required to process the organic functional layer 6, and the process steps are decreased), so that the first conductive connection part 3a in the first auxiliary electrode 3 is exposed through the hollow structure 8, to facilitate connection of the second electrode 7 subsequently formed with the first conductive connection part 3a, to form a parallel connection with between the second electrode 7 and the first auxiliary electrode 3.

It is to be noted that in the embodiments of the present disclosure, the structure and shape of the first auxiliary electrode 3 may be changed, but the first auxiliary electrode 3 at least comprises a first conductive connection part 3a attached to the side surface of the boss 4.

In this embodiment, for example, the material of the first auxiliary electrode 3 comprises a conductive material capable of forming a film by a sputtering process or an atomic layer deposition process. Because the process materials in the sputtering process and the atomic layer deposition process have good permeability, when the conductive film is formed by the sputtering process or the atomic layer deposition process, the conductive film will be deposited to the upper surface of the boss 4, and be deposited to the side surface of the boss 4. A pattern of the first auxiliary electrode 3 at least comprising the first conductive connection part 3a can be formed by patterning the conductive film through a patterning process.

It is to be noted that the patterning process in the embodiments of the present disclosure refers to the process including photoresist coating, exposure, development, etching, photoresist stripping, or the like.

In addition, for example, as shown in the drawings, after the patterning process is performed to the conductive film, the upper surface of the boss 4 is also covered with the conductive material disposed in the same layer as the first conductive connection part 3a, but the embodiments of the present disclosure are not limited thereto. In the embodiments of the present disclosure, the upper surface of the boss 4 may be covered with a conductive material, or may not be covered with a conductive material, but only the first conductive connection part 3a formed on the side surface of the boss 4.

For example, the first auxiliary electrode 3 may have a three-layer conductive material stack structure of indium tin oxide/silver/indium tin oxide. In this case, the preparation process of the first auxiliary electrode 3 is substantially as follows: forming a first layer of indium tin oxide material film by a sputtering process or an atomic layer deposition process, and patterning the first layer of indium tin oxide material film to form a first layer of indium tin oxide pattern; forming a silver material film by a sputtering process or an atomic layer deposition process again, and patterning the silver material film to form a silver pattern; forming a second layer of indium tin oxide material film again by a sputtering process or an atomic layer deposition process, and patterning the second layer of indium tin oxide material film to form a second layer of indium tin oxide pattern; and forming the first layer of indium tin oxide pattern, the silver pattern and the second layer of indium tin oxide pattern into the first auxiliary electrode 3.

It is to be noted that when the first auxiliary electrode 3 comprises at least two layers of conductive structures, at least one layer of conductive structures may be located on the side surface of the boss 4 to form the first conductive connection part 3a.

Exemplarily, the material of the second electrode 7 comprises a conductive material capable of forming a film by a sputtering process or an atomic layer deposition process. In this case, when a conductive film for preparing the second electrode 7 is formed by a sputtering process or an atomic layer deposition process, the conductive film may be connected to the first conductive connection part 3a through a hollow structure 8 (the side surface of the boss 4) in the organic functional layer 6.

The first auxiliary electrode 3 and the second electrode 7 mentioned above respectively comprises a conductive material capable of forming a film by a sputtering process or an atomic layer deposition process, which is an example of the present disclosure, and the embodiments of the present disclosure are not limited thereto. In the embodiments of the present disclosure, the first auxiliary electrode 3 and the second electrode 7 include conductive material(s).

In the embodiments of the present disclosure, in order to facilitate the attachment of the first conductive connection part 3a to the side surface of the boss 4 and to avoid the attachment of the organic functional layer 6 to the side surface of the boss 4, for example, the dihedral angle theta formed by the side surface of the boss 4 and the surface of the boss 4 facing away from the base substrate 1 ranges from 60 degrees or greater to 90 degrees or less.

Exemplarily, the material of the boss 4 comprises a negative photoresist. For the case where the negative photoresist serves as the material of the boss 4, for example, the preparation process of the boss 4 is described as follows: the negative photoresist is applied on the base substrate; from the side of the negative photoresist facing away from the base substrate 1, the negative photoresist in the area where the boss 4 is to be formed is exposed by using an exposure device and a mask, and organic molecules in the negative photoresist of the exposed area undergo photocrosslinking reaction to form an insoluble network structure which functions as an anti-corrosion layer; in the exposed area, because the light intensity at the edge position of the exposed area is relatively weak, and the light penetration capability at the edge position is relatively weak, the portion at the edge position of the exposed area and near the base substrate 1 is not irradiated, that is, the longitudinal cross section (the cross section perpendicular to the base substrate 1) of the actually irradiated part in the exposed area is inverted trapezoidal in shape; next, the negative photoresist is developed with a developing solution, the non-irradiated portion in the negative photoresist is dissolved in the developing solution and the irradiated portion is retained to form the boss 4, and the area of the horizontal cross section (the cross section parallel to the base substrate 1) of the boss 4 gradually decreases in the direction close to the base substrate 1.

Exemplarily, the boss 4 comprises an inorganic insulating material, such as silicon oxide, in this case, an inorganic insulating material film with a given thickness can be formed first, and the inorganic insulating material film is dry etched (anisotropic dry etching, only vertical etching is performed and no transverse drilling etching is performed) to form the boss 4, and the side surface of the boss 4 is perpendicular to the upper surface of the boss 4.

In the embodiments of the present disclosure, for example, the first auxiliary electrode 3 is disposed in a same layer as the first electrode 2. In this case, the first auxiliary electrode 3 and the first electrode 2 can be prepared simultaneously by using a single patterning process, and the production process steps are decreased.

Figure 3:
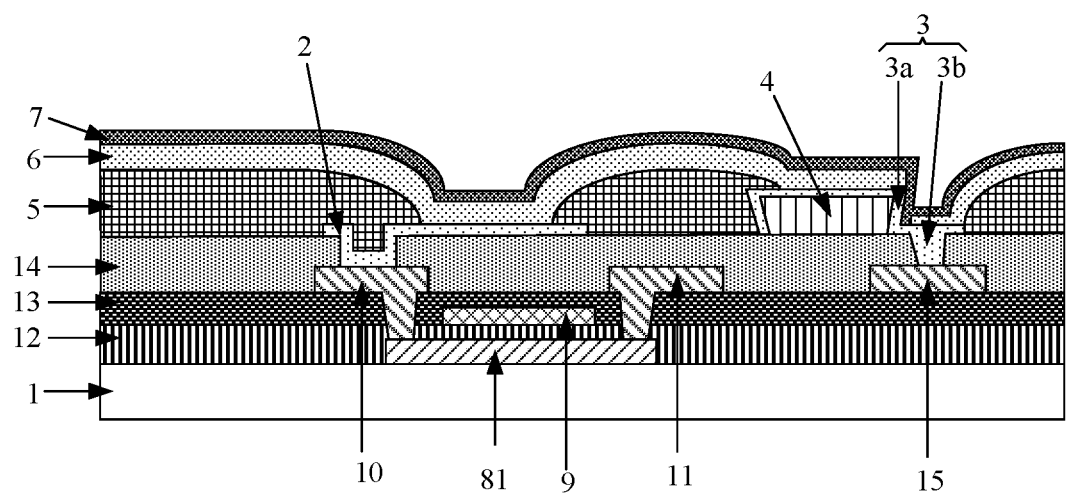
FIG. 3 is a schematically cross-sectional view of a display substrate provided in another embodiment of the present disclosure.

FIG. 3 is a schematically cross-sectional view of a display substrate provided in another embodiment of the present disclosure. As shown in FIG. 3, unlike the first embodiment, in this embodiment, a thin film transistor is provided between the first electrode 2 and the base substrate 1, the thin film transistor comprises an active layer 81, a gate electrode 9, a source electrode 10 and a drain electrode 11, and the first electrode 2 is electrically connected to the source electrode 10 or the drain electrode 11 (only the case where the first electrode 2 is connected to the source electrode 10 is exemplarily shown in the figure).

It is to be noted that FIG. 3 only exemplarily shows the case where the thin film transistor is a top-gate-type thin film transistor, but the embodiments of the present disclosure are not limited thereto, for example, the thin film transistor in the embodiments of the present disclosure may also be a bottom-gate-type thin film transistor.

For example, for the top-gate-type thin film transistor shown in FIG. 3, a gate insulator layer 12 is arranged between the active layer 81 and the gate electrode 9, an interlayer dielectric film 13 is formed between the gate electrode 9 and the source electrode 10/drain electrode 11, and a planarization layer 14 is formed between the source electrode 10/drain electrode 11 and the first electrode 2. A buffer layer may also be arranged between the top-gate-type thin film transistor and the base substrate 1.

For example, the display substrate further comprises: a second auxiliary electrode 15 connected with the first auxiliary electrode 3 in parallel. The second auxiliary electrode 15 is provided in a same layer as at least one of the gate electrode 9 and the drain electrode 11. In this case, the second electrode 7, the first auxiliary electrode 3, and the second auxiliary electrode 15 are connected in parallel. In this way, the equivalent resistance at the second electrode 7 can be further reduced. In addition, because the second auxiliary electrode 15 is disposed in the same layer as the gate electrode 9 and/or the drain electrode 11, the second auxiliary electrode 15 can be simultaneously prepared in the process of preparing the gate electrode 9 and/or the drain electrode 11 by a patterning process, and the production process steps is decreased.

It is to be noted that the manner in which the second auxiliary electrode 15 and the first auxiliary electrode 3 are connected in parallel in the present disclosure may be similar to the manner in which the second electrode 7 and the first auxiliary electrode 3 are connected in parallel in the above embodiment previously described, which is not repeated here.

Further, for example, in order to facilitate the connection of the first auxiliary electrode 3 with the second auxiliary electrode 15, the first auxiliary electrode 3 further comprises a second conductive connection part 3b provided in a same layer as and electrically connected to the first conductive connection part 3a, and the second conductive connection part 3b is connected with the second auxiliary electrode 15. In this case, the second electrode 7 is electrically connected to the second auxiliary electrode 15 through the first conductive connection part 3a and the second conductive connection part 3b.

For example, an insulating structure may also be provided between the first auxiliary electrode 3 and the second auxiliary electrode 15. For example, the insulating structure is provided with a via hole structure through which the first auxiliary electrode 3 is electrically connected to the second auxiliary electrode 15.

For the case shown in FIG. 3, for example, the second auxiliary electrode 15 is disposed in a same layer as the source electrode 10 and the drain electrode 11, in which case, the insulating layer structure refers to a planarization layer 14 in which a via hole structure is formed, and the first auxiliary electrode 3 is electrically connected to the second auxiliary electrode 15 through the via hole structure in the planarization layer 14.

Figure 4:
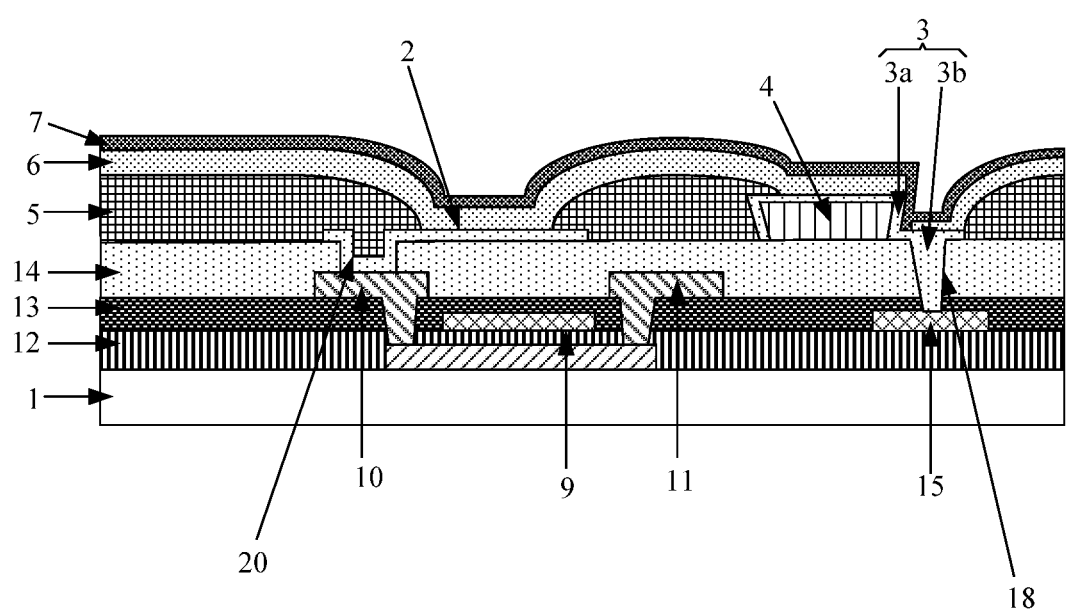
FIG. 4 is a schematically cross-sectional view of another display substrate provided in the another embodiment of the present disclosure.

FIG. 4 is a schematically cross-sectional view of another display substrate provided in the second embodiment of the present disclosure. Different from the display substrate shown in FIG. 3, the second auxiliary electrode 15 shown in FIG. 4 is disposed in a same layer as the gate electrode 9, in which case, the insulating layer structure refers to the interlayer dielectric film 13 and the planarization layer 14, in which a via hole structure communicated with the second auxiliary electrode 15 is formed, and the first auxiliary electrode 3 is electrically connected with the second auxiliary electrode 15 through the via hole structure.

Figure 5:
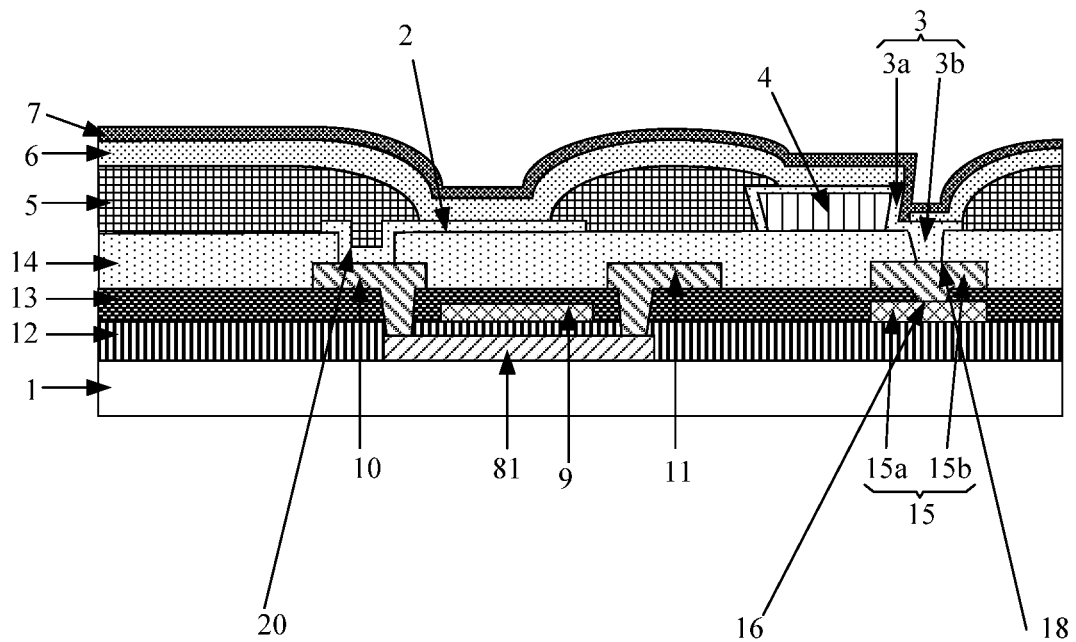
FIG. 5 is a schematically cross-sectional view of yet another display substrate provided in the another embodiment of the present disclosure.

FIG. 5 is a schematic cross-sectional view of yet another display substrate provided in the second embodiment of the present disclosure. Different from the display substrates shown in FIGS. 3 and 4, the second auxiliary electrode 15 shown in FIG. 5 has a double-layer structure comprising a first portion 15a provided in a same layer as the gate electrode 9 and a second portion 15b provided in a same layer as the source electrode 10 and the drain electrode 11. The first portion 15a and the second portion 15b are electrically connected through a via hole in the inter level dielectric layer 13. In this case, the first auxiliary electrode 3 is electrically connected with the second portion 15b of the second auxiliary electrode 15 through a via hole structure in the planarization layer 14 to realize a parallel connection of the first auxiliary electrode 3 with the second auxiliary electrode 15.

Figure 6:
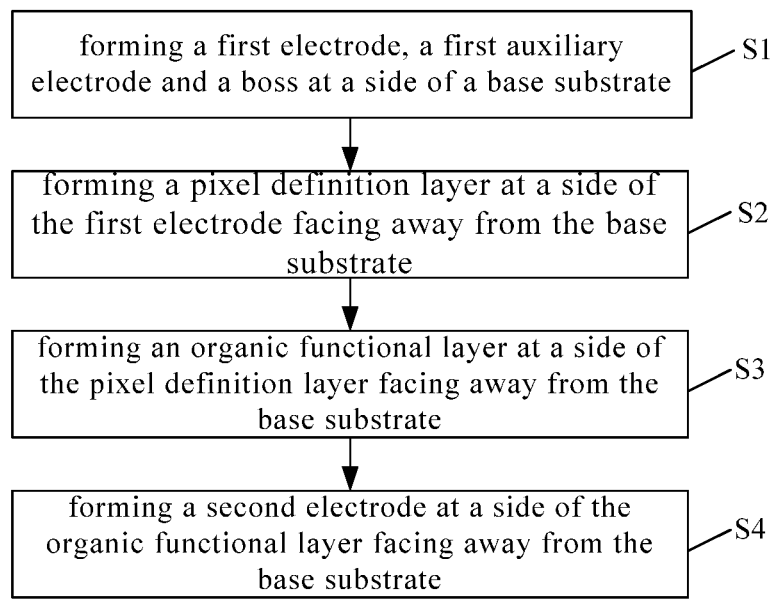
FIG. 6 is a flowchart of a method of manufacturing a display substrate provided in yet another embodiment of the present disclosure.

FIG. 6 is a flowchart of a method of manufacturing a display substrate provided in yet another embodiment of the present disclosure. The method is used for manufacturing the display substrate provided in the previous embodiments. As shown in FIG. 6, the method comprises following operations.

Step S1: forming a first electrode, a first auxiliary electrode, and a boss on a surface of a base substrate.

Figure 7A:
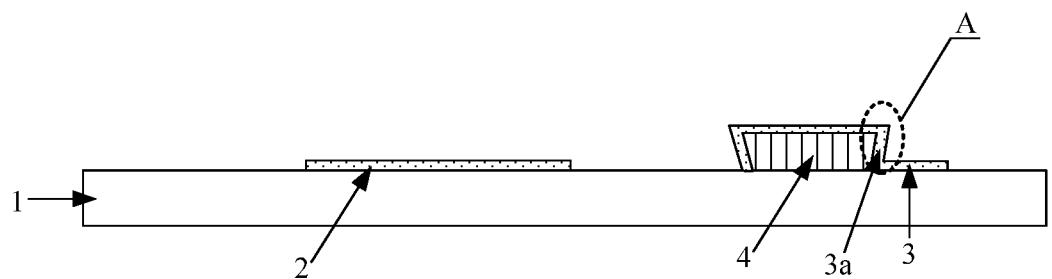
FIG. 7A is a schematically cross-sectional view of a display substrate where a first electrode, a first auxiliary electrode and a boss are formed.

The formation of structures of the display substrate shown in FIG. 1A will be described as an example. As shown in FIG. 7A, a first electrode 2, a first auxiliary electrode 3, and a boss 4 are formed on a base substrate 1. The orthographic projection of the surface of the boss 4 facing away from the base substrate 1 on the base substrate 1 completely overlaps with the orthographic projection of the boss 4 on the base substrate 1, and the first auxiliary electrode 3 comprises a first conductive connection part 3a contacting (for example, attached to) a predetermined area A on the side surface of the boss 4.

For example, Step S1 may include Step S101 and S102.

Step S101: forming a boss 4 is on a surface of a base substrate 1.

As an example of step S101, for example, a negative photoresist is coated on a surface of the base substrate 1; the negative photoresist in the area where the boss 4 is to be formed is exposed; the negative photoresist is developed to form the boss 4. The cross-sectional area of the boss 4 prepared by the above step gradually decreases in the direction close to the base substrate 1.

As another example of Step S101, for example, an inorganic insulating material film (e.g., silicon oxide) with a given thickness is formed on a surface of the base substrate 1; the inorganic insulating material film is dry etched to form the boss 4. The side surface of the boss 4 prepared by the above step is perpendicular to the upper surface.

Step S102: forming a first auxiliary electrode and a first electrode on a surface of the base substrate.

For example, Step S102 includes forming a first conductive film by a sputtering process or an atomic layer deposition process. Because the process materials in the sputtering process and the atomic layer deposition process have good permeability, when the first conductive film is formed by the sputtering process or the atomic layer deposition process, the first conductive film will be deposited to the surface of the base substrate 1 and the upper surface of the boss 4, and be deposited to the side surface of the boss 4; patterning the first conductive film by a patterning process to form a pattern of the first auxiliary electrode 3 and the first electrode 2. The first auxiliary electrode 3 comprises a first conductive connection part 3*a* contacting (e.g., attached to) a predetermined area A on the side surface of the boss 4.

It is to be noted that in the embodiments of the present disclosure, the process for forming the first conductive film is not limited to the sputtering process and the atomic layer deposition process, and any process capable of attaching the conductive material to the side surface of the boss 4 to form a corresponding film is within the scope of the present disclosure.

The first conductive film mentioned above may be a film comprising one conductive material or a conductive film formed by stacking different conductive material layers (e.g., indium tin oxide/silver/indium tin oxide), but the embodiments of the present disclosure are not limited thereto.

In addition, the above-mentioned method of forming the first auxiliary electrode 3 and the first electrode 2 in the same patterning process can effectively decrease production process steps and production costs.

In the embodiments of the present disclosure, for example, the first auxiliary electrode 3 and the first electrode 2 may also be formed in different patterning processes, for example, a pattern of the first electrode 2 is first formed by the patterning process, then the boss 4 is formed, and finally the first auxiliary electrode 3 is formed; or, the boss 4 is first formed, and then the first auxiliary electrode 3 and the first electrode 2 are respectively formed by different patterning processes. In the embodiments of the present disclosure, for example, the preparation process of the first auxiliary electrode 3 always follows the preparation process of the boss 4.

It is to be noted that in the embodiments of the present disclosure, the first auxiliary electrode 3 comprises at least a first conductive connection part 3*a* attached to the side surface of the boss 4.

Step S2: forming a pixel definition layer on a side of the first electrode facing away from the base substrate.

Figure 7B:
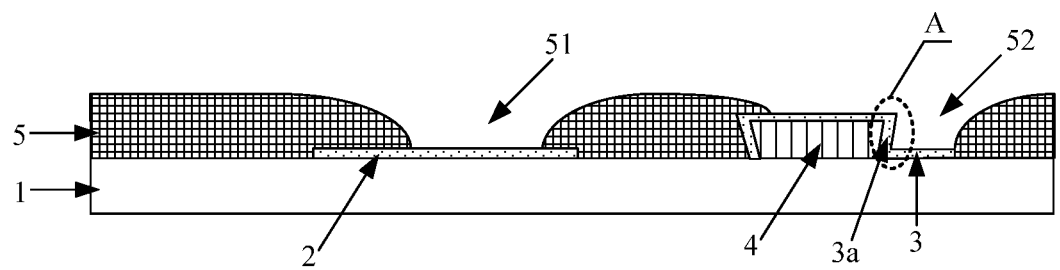
FIG. 7B is a schematically cross-sectional view of the display substrate where a pixel definition layer is formed.

FIG. 7B is a schematically cross-sectional view with a pixel definition layer is formed. As shown in FIG. 7B, the pixel definition layer 5 is formed with a pixel accommodating hole 51 and a slot 52, the pixel accommodating hole 51 is communicated with the first electrode 2, the slot 52 is communicated with the first conductive connection part 3*a*, and the pixel definition layer 5 is configured to isolate adjacent organic light-emitting diodes. The pixel definition layer 5 is formed of an organic insulating material (e.g., acrylic resins) or an inorganic insulating material (e.g., silicon nitride or silicon oxide), and has insulating properties.

Step S3: forming an organic functional layer on a side of the pixel definition layer facing away from the base substrate.

Figure 7C:
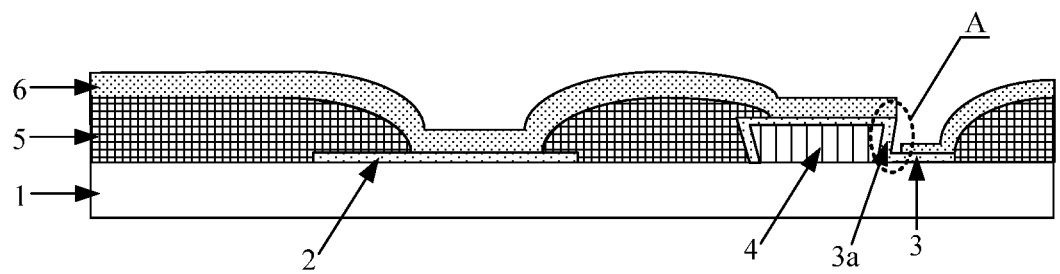
FIG. 7C is a schematically cross-sectional view of the display substrate where an organic functional layer is formed.

FIG. 7C is a schematically cross-sectional view with an organic functional layer being formed. As shown in FIG. 7C, the organic functional layer 6 at least comprises an organic light-emitting layer. For example, the organic functional layer 6 may also selectively comprise functional film layers, such as a hole transport layer, an electron transport layer, a hole blocking layer, an electron blocking layer, or the like, in this way, the efficiency of carrier injection into the organic light-emitting layer can be improved.

In the process of preparing the organic functional layer 6, various functional film layers are formed on a surface of the pixel definition layer 5 facing away from the base substrate 1, in the pixel accommodating hole 51, and in the slot 52 by one or more evaporation processes. In the pixel accommodating hole 51, the organic functional layer 6 is electrically connected to the first electrode 2; in the slot 52, the various functional film layers generate a segment difference at the side surface of the boss 4, that is, the organic functional layer 6 is a hollow structure at the side surface of the boss 4 (including a predetermined area), and in this case, the first conductive connection part 3*a* of the first auxiliary electrode 3 is exposed.

Step S4: forming a second electrode on a side of the organic functional layer facing away from the base substrate.

With reference to FIG. 1A again, the second electrode 7 is electrically connected to the first conductive connection part 3*a* through the hollow structure 8 so that the second electrode 7 is connected with the first auxiliary electrode 3 in parallel.

For example, Step S104 includes forming a second conductive film by a sputtering process or an atomic layer deposition process, the second conductive film is deposited on the surface of the organic functional layer 6 facing away from the base substrate 1 and the hollow structure 8, the second conductive film is electrically connected with the first conductive connection part 3*a* through the hollow structure 8, and the second conductive film is patterned to form the second electrode 7 by a patterning process.

It is to be noted that, in the embodiments of the present disclosure, the process of forming the second conductive film is not limited to the sputtering process and the atomic layer deposition process, and any process capable of attaching the conductive material to the side surface of the boss 4 to form a film connected to the first conductive connection part 3*a* is within the scope of the present disclosure.

In addition, the above second conductive film may be a film formed of one conductive material, or may be a conductive film formed by stacking different conductive material layers (e.g., magnesium silver alloy/indium zinc oxide), but the embodiments of the present disclosure are not limited thereto.

The first electrode 2, the organic functional layer 6, and the second electrode 7 form an organic-light emitting diode. In the embodiments of the present disclosure, the structures and materials of the first electrode 2 and the second electrode 7 can be designed. For example, when the organic light-emitting diode is a top-emission-type organic light-emitting diode, the first electrode 2 is a reflective electrode and the second electrode 7 is a transmissive electrode; when the organic light-emitting diode is a bottom-emission-type organic light-emitting diode, the first electrode 2 is a transmissive electrode and the second electrode 7 is a reflective electrode; and when the organic light-emitting diode is a bidirectional emission organic light-emitting diode, the first electrode 2 and the second electrode 7 are both transmissive electrodes.

The reflective electrode may be an electrode formed by a metal material layer with a relatively large thickness (about 40 nm to about 120 nm) (the thickness is relatively large and the surface can reflect light), or an electrode formed by stacking a metal material layer with a relatively large thickness and a transparent conductive material layer. When the transparent conductive material layer is located on a side of the metal material layer facing the organic functional layer 6, the work function of the metal material layer can be improved, so that the first electrode 2 and the organic functional layer 6 can be better matched; and when the transparent conductive material layer is located on a side of the metal material facing away from the organic functional layer 6, it can be connected with the metal material layer in parallel to reduce the equivalent resistance of the reflective electrode.

The transmissive electrode may be an electrode formed of a transparent conductive material layer, or an electrode formed of a metal material layer with a relatively small thickness (about 3 nm to about 30 nm) (the thickness is relatively small and the light transmittance is relatively great), or an electrode formed of a metal material layer with a relatively small thickness and a transparent conductive material layer located on a side of the metal material layer facing away from the organic functional layer 6 (serving as a light extraction layer to enhance the light extraction rate of the transmissive electrode while being connected with the metal material layer in parallel to reduce the equivalent resistance of the transmissive electrode).

It is to be noted that the material of the above-mentioned metal material layer may be a single metal selected from a group consisting of copper, chromium, molybdenum, gold, silver, platinum, and the like, or an alloy formed thereof. The transparent conductive material layer may be made of indium tin oxide, indium zinc oxide, indium gallium oxide, gallium zinc oxide, zinc oxide, indium oxide, aluminum zinc oxide, carbon nanotubes, or the like.

Figure 8:
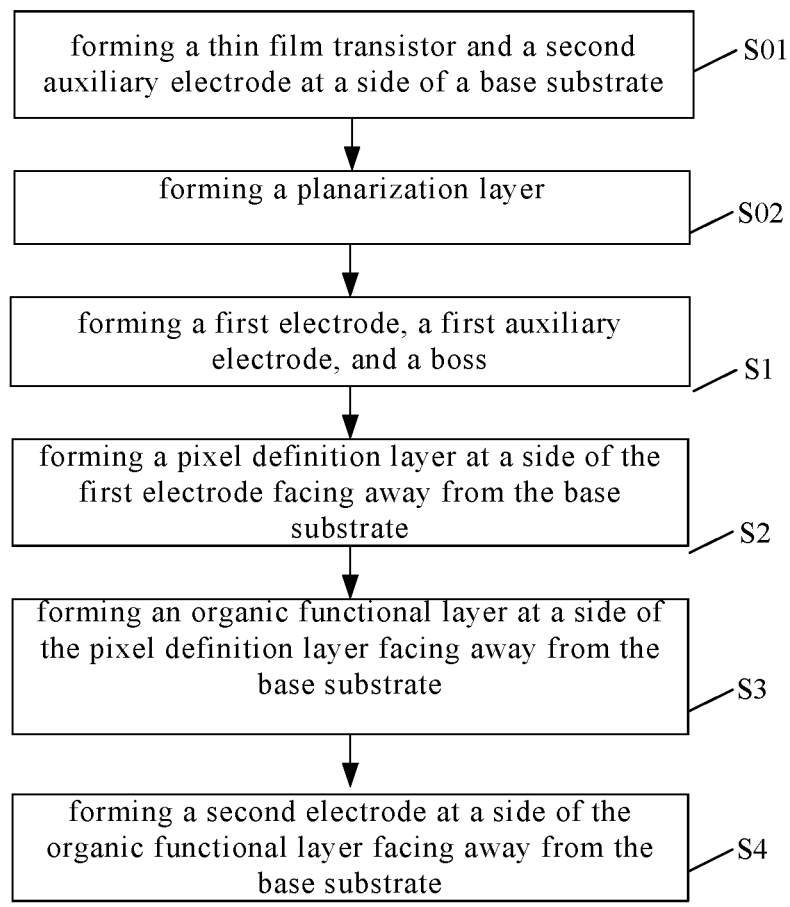
FIG. 8 is a flowchart of a method of manufacturing a display substrate provided in still another embodiment of the present disclosure.

FIG. 8 is a flowchart of a method of manufacturing a display substrate provided in yet another embodiment of the present disclosure. As shown in FIG. 8, the method is used to prepare the display substrate provided in the second embodiment. The preparation method includes steps S1 to S4 in the third embodiment, and it also includes Steps S01 to S02 prior to step S1. Only Steps S01 and S02 will be described in detail below, and the rest of the repeated steps will not be further described.

Step S01: forming a thin film transistor and a second auxiliary electrode 15 on a surface of the base substrate 1.

The thin film transistor and the second auxiliary electrode 15 may be prepared by adopting an existing thin film transistor preparation process.

The thin film transistor comprises: an active layer 81, a gate electrode 9, a source electrode 10 and a drain electrode 11. For example, the second auxiliary electrode 15 is formed in the same patterning process as at least one of the gate electrode 9 and the drain electrode 11.

In the embodiments of the present disclosure, the thin film transistor may be either a top-gate-type thin film transistor or a bottom-gate-type thin film transistor. The following is an exemplary description with the thin film transistor being a top-gate-type thin film transistor as an example.

In the process of forming the top-gate-type thin film transistor, a gate insulating layer 12 and an interlayer dielectric film 13 which play an insulating role can also be formed.

In Step S01, when the second auxiliary electrode 15 has a double-layer structure including a first portion 15*a* disposed in the same layer as the gate electrode 9 and a second portion 15*b* disposed in the same layer as the drain electrode 11 (as shown in FIG. 5), a via hole 16 is formed on the interlayer dielectric film 13 to allow the first portion 15*a* and the second portion 15*b* to be electrically connected through the via hole 16.

Step S02: forming a planarization layer 14.

In Step S02, the planarization layer 14 is formed on a side of the thin film transistor facing away from the base substrate 1, and a via hole structure 18 and a connection hole 20 are formed on the planarization layer 14 by a patterning process. The via hole structure 18 is configured to connect the first auxiliary electrode 3 subsequently formed with the second auxiliary electrode 15, and the connection hole 20 is configured to connect the first electrode 2 subsequently formed with the source electrode 10 or the drain electrode 11.

When the second auxiliary electrode 15 is like the situations as shown in FIG. 3 or FIG. 5, the via hole structure 18 only runs through the planarization layer 14; and when the second auxiliary electrode 15 is the structure shown in FIG. 4, the via hole structure 18 runs through not only the planarization layer 14 but also the interlayer dielectric film 13.

After Step S02 is completed, Steps S1 to S4 in the third embodiment are further conducted to prepare the organic light-emitting diode and the first auxiliary electrode 2. In Step S1, the first electrode 2 of the organic light-emitting diode is connected to the source electrode 10 or drain electrode 11 of the thin film transistor through a connection hole 20, and the first auxiliary electrode 3 is connected to the second auxiliary electrode 15 through a via hole structure 18.

Yet another embodiment of the present disclosure also provides a display panel, comprising: a display substrate, which is the display substrate provided in the first embodiment or the second embodiment above. Reference may be made to the first and second embodiments and no further description will be repeated here.

The above description is only exemplary embodiments of the present disclosure and is not intended to limit the present disclosure. Any modifications, equivalents, improvements, or the like made within the principles of the present disclosure are intended to be included within the scope of the present disclosure.

What is claimed is:

1. A display substrate, comprising:
    a base substrate, and
    a first electrode, a first auxiliary electrode, a boss, a pixel definition layer, an organic functional layer, and a second electrode on the base substrate;
    wherein the first auxiliary electrode comprises a first conductive connection part contacting a side surface of the boss;
    the pixel definition layer comprises a pixel accommodating hole and a slot;
    the organic functional layer is electrically connected with the first electrode through the pixel accommodating hole; and
    the second electrode is electrically connected with the first conductive connection part through the slot, so that the second electrode is connected with the first auxiliary electrode in parallel;
    wherein a surface of the boss facing away from the base substrate has an orthographic projection on the base substrate completely overlapping with an orthographic projection of the boss on the base substrate;
a thin film transistor is disposed between the first electrode and the base substrate, the thin film transistor comprising: a gate electrode, a source electrode and a drain electrode, wherein the first electrode is electrically connected to the source electrode or the drain electrode; and
a second auxiliary electrode connected with the first auxiliary electrode in parallel;
wherein the second auxiliary electrode is disposed in a same layer as at least one of the gate electrode, the source electrode and the drain electrode.

2. The display substrate according to claim 1, wherein the first conductive connection part is disposed in a predetermined area on the side surface of the boss; the organic functional layer comprises a hollow structure in the predetermined area; the second electrode is electrically connected with the first conductive connection part through the hollow structure; the pixel accommodating hole is communicated with the first electrode; and the slot is communicated with the first conductive connection part.

3. The display substrate according to claim 1, wherein the boss includes material of a negative photoresist.

4. The display substrate according to claim 1, wherein the first auxiliary electrode further comprises a second conductive connection part disposed in a same layer as, and electrically connected with the first conductive connection part; and
the second conductive connection part is electrically connected with the second auxiliary electrode.

5. The display substrate according to claim 1, further comprising: an insulating structure disposed between the first auxiliary electrode and the second auxiliary electrode;
wherein the insulating structure is provided with a via hole structure, and the first auxiliary electrode is electrically connected with the second auxiliary electrode through the via hole structure.

6. The display substrate according to claim 1, wherein the first auxiliary electrode is disposed in a same layer as the first electrode.

7. The display substrate according to claim 1, wherein a dihedral angle theta (Θ) formed by the side surface of the boss and the surface of the boss facing away from the base substrate is equal to or greater than 60 degrees and equal to and less than 90 degrees.

8. A method of manufacturing a display substrate, comprising:
forming a boss, a first electrode, a first auxiliary electrode, a pixel definition layer, an organic functional layer and a second electrode on a surface of a base substrate;
wherein the forming the first auxiliary electrode on the surface of the base substrate comprises forming a first conductive connection part of the first auxiliary electrode contacting a predetermined area on a side surface of the boss; and
forming a pixel accommodating hole and a slot in the pixel definition layer;
wherein the organic functional layer is electrically connected with the first electrode through the pixel accommodating hole, and
the second electrode is electrically connected with the first conductive connection part through the slot and is connected with the first auxiliary electrode in parallel; wherein
a surface of the boss facing away from the base substrate has an orthographic projection on the base substrate completely overlapping with an orthographic projection of the boss on the base substrate;
the first conductive connection part is formed in a predetermined area on a side surface of the boss; and
a hollow structure is formed in the predetermined area in the organic functional layer, and the second electrode is electrically connected with the first conductive connection part through the hollow structure;
wherein the forming the boss on the surface of the base substrate comprises:
coating a negative photoresist on the surface of the base substrate;
exposing the negative photoresist in an area where a boss is to be formed; and
developing the negative photoresist to form the boss.

9. The method of manufacturing the display substrate according to claim 8, wherein the first auxiliary electrode and the first electrode are formed in a same patterning process.

10. The method for manufacturing the display substrate according to claim 8, wherein the forming the first auxiliary electrode on the surface of the base substrate comprises:
forming a first conductive film by a sputtering process or an atomic layer deposition process on a surface of the base substrate, the surface of the boss facing away from the base substrate and the side surface of the boss; and
patterning the first conductive film to form a pattern of the first auxiliary electrode, wherein the first auxiliary electrode comprises the first conductive connection part contacting the predetermined area on the side surface of the boss.

11. The method of manufacturing the display substrate according to claim 8, wherein the forming the organic functional layer on the surface of the base substrate comprises:
forming the organic functional layer on a surface of the pixel definition layer facing away from the base substrate, in the pixel accommodating hole and in the slot by an evaporation process, wherein the organic functional layer is a hollow structure in the predetermined area, so that the first conductive connection part is exposed through the hollow structure.

12. The method of manufacturing the display substrate according to claim 8, wherein the forming the second electrode on the surface of the base substrate:
forming a second conductive film by a sputtering process or an atomic layer deposition process on a surface of the organic functional layer facing away from the base substrate and the hollow structure, the second conductive film being electrically connected with the first conductive connection part through the hollow structure, and the second conductive film serving as the second electrode.

13. The method of manufacturing the display substrate according to claim 8, further comprising:
before forming the first electrode, the first auxiliary electrode and the boss on the surface of the base substrate, forming a thin film transistor on the surface of the base substrate, wherein the thin film transistor comprises: a gate electrode, a source electrode and a drain electrode, and the first electrode is electrically connected with the source electrode or the drain electrode.

14. The method of manufacturing the display substrate according to claim 13, further comprising:
forming a second auxiliary electrode, wherein the second auxiliary electrode is connected with the first auxiliary electrode in parallel, and the second auxiliary electrode is formed in a same patterning process as at least one of the gate electrode, the source electrode, and the drain electrode.

15. The method of manufacturing the display substrate according to claim 14, further comprising:
   forming an insulating structure between the first auxiliary electrode and the second auxiliary electrode, wherein a via hole structure is provided in the insulating structure, and the first auxiliary electrode is electrically connected with the second auxiliary electrode through the via hole structure.

16. A display panel, comprising a display substrate, wherein the display substrate comprises:
   a base substrate, and
   a first electrode, a first auxiliary electrode, a boss, a pixel definition layer, an organic functional layer, and a second electrode on the base substrate;
   wherein the first auxiliary electrode comprises a first conductive connection part contacting a side surface of the boss;
   the pixel definition layer comprises a pixel accommodating hole and a slot;
   the organic functional layer is electrically connected with the first electrode through the pixel accommodating hole; and
   the second electrode is electrically connected with the first conductive connection part through the slot, so that the second electrode is connected with the first auxiliary electrode in parallel;
   wherein a surface of the boss facing away from the base substrate has an orthographic projection on the base substrate completely overlapping with an orthographic projection of the boss on the base substrate;
   a thin film transistor is disposed between the first electrode and the base substrate, the thin film transistor comprising: a gate electrode, a source electrode and a drain electrode, wherein the first electrode is electrically connected to the source electrode or the drain electrode; and
   a second auxiliary electrode connected with the first auxiliary electrode in parallel;
   wherein the second auxiliary electrode is disposed in a same layer as at least one of the gate electrode, the source electrode and the drain electrode.

* * * * *